United States Patent
Takeuchi et al.

(10) Patent No.: US 6,534,897 B2
(45) Date of Patent: Mar. 18, 2003

(54) SURFACE ACOUSTIC WAVE DEVICE

(75) Inventors: Masao Takeuchi, Tokyo (JP); Kenji Inoue, Tokyo (JP); Katsuo Sato, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/934,524

(22) Filed: Aug. 23, 2001

(65) Prior Publication Data
US 2002/0011761 A1 Jan. 31, 2002

Related U.S. Application Data

(63) Continuation of application No. PCT/JP01/00014, filed on Jan. 5, 2001.

(30) Foreign Application Priority Data

Jan. 7, 2000 (JP) ........................................ 2000-001910
May 11, 2000 (JP) ........................................ 2000-139105

(51) Int. Cl.⁷ ................................................ H03H 9/25
(52) U.S. Cl. ................................. 310/313 A; 310/313 R
(58) Field of Search ............................. 310/313 A, 358, 310/360

(56) References Cited

U.S. PATENT DOCUMENTS

| | | | |
|---|---|---|---|
| 4,910,839 A | | 3/1990 | Wright |
| 6,097,131 A | * | 8/2000 | Naumenko et al. ...... 310/313 A |
| 2002/0015452 A1 | * | 2/2002 | Chai et al. .................. 375/316 |
| 2002/0017828 A1 | * | 2/2002 | Roesler .................. 310/313 A |
| 2002/0021193 A1 | * | 2/2002 | Chai et al. .................. 333/187 |

FOREIGN PATENT DOCUMENTS

| | | | | |
|---|---|---|---|---|
| JP | A 61-136313 | 6/1986 | | |
| JP | A 8-97672 | 4/1996 | | |
| JP | A-10-284981 | 10/1998 | | |
| JP | A 10-284982 | 10/1998 | | |
| JP | A 10-284983 | 10/1998 | | |
| JP | A-11-261369 | 9/1999 | | |
| JP | A-11-340782 | 12/1999 | | |
| JP | 2000138557 A | * | 5/2000 | ............ H03H/9/25 |
| JP | 2001060845 A | * | 3/2001 | ............ H03H/9/25 |
| WO | WO 99/48200 | 9/1999 | | |

OTHER PUBLICATIONS

Noritoshi Kimura and Masao Takeuchi, "Direct Numerical Analysis of SAW Coupling–of–Modes Equations and Its Applications to Weighted Single–Phase Unidirectional Transducers and Weighted Reflectors", Proceedings of IEEE Ultrasonics Symposium, pp. 203–208, 1999.

(List continued on next page.)

Primary Examiner—Nestor Ramirez
Assistant Examiner—J. Aguirrechea
(74) Attorney, Agent, or Firm—Oliff & Berridge, PLC.

(57) ABSTRACT

The invention is to realize a surface acoustic wave device that attains a wide band and a small size, and lowers a loss by utilizing the natural single-phase unidirectional transducer characteristics.

The surface acoustic wave device comprises a piezoelectric substrate (1) and a pair of interdigitated electrodes (2) provided on one main surface of the piezoelectric substrate 1. As the material of the piezoelectric substrate (1), a single crystal is used that belongs to the point group 32, has the $Ca_3Ga_2Ge_4O_{14}$ type crystalline structure, comprises La, Ta, Ga and O as main components, and is represented by a chemical formula $La_3Ta_{0.5}Ga_{5.5}O_{14}$. When the cut angle of the substrate (1) and the propagation direction are represented by Eulerian angles ($\phi$, $\theta$, $\psi$), $\phi$, $\theta$ and $\psi$ are in a first region where $\phi$ is from −5° to 5°, $\theta$ is from 135° to 155°, and $\psi$ is from 15° to 40°, or in a second region where $\phi$ is from 10° to 20°, $\theta$ is from 140° to 157°, and $\psi$ is from 30° to 60°.

1 Claim, 9 Drawing Sheets

OTHER PUBLICATIONS

Takeuchi, "NSPUDT Orientations in Langasite Family Piezoelectric Single Crystal Substrates", Bimillennium High–Technology Symposium on Piezoelectric Materials and Elastic Wave Devices organized by IEEICE Tohoku Section, pp. 139–146, Feb. 2000 (w/ partial translation).

Onozato et al., Surface Acoustic Wave Propagation characteristics of Ta Substituted Type Langasite ($La_3Ta_{0.5}GA_{5.5}O_{14}$), Proceedings of the 20$^{th}$ Symposium on the Fundamentals and Applications of Ultrasonic Electronics, pp. 49–50, Nov. 1999 (w/ partial translation).

Takeda et al., Crystal Growth and Structural Characterization of New Piezoelectric Material $La_3Ta_{0.5}Ga_{5.5}O_{14}$, Japanese Journal of Applied Physics, Part 2 Letters, vol. 36, No. 7B, pp. L919–L921, Jul. 15, 1997.

* cited by examiner

SURFACE ACOUSTIC WAVE DEVICE

This is a continuation of Application No. PCT/JP01/00014 filed Jan. 5, 2001. The entire disclosure of the prior application is hereby incorporated by reference herein in its entirety.

TECHNICAL FIELD

The present invention relates to a surface acoustic wave device having natural single-phase unidirectional transducer characteristics.

BACKGROUND ART

In recent years, mobile communication terminals such as cellular phones have rapidly become widespread. Such terminals are desired to be reduced in size and weight from the viewpoint of portability. In order to achieve reduction in size and weight of the terminals, electronic parts used therein are required to be reduced in size and weight, too. For that purpose, a surface acoustic wave device, i.e., a surface acoustic wave filter, which is advantageous for reduction in size and weight, is often employed in the high frequency section and the intermediate frequency section of the terminals. The surface acoustic wave device is formed by providing interdigitated electrodes for exciting, receiving, reflecting or propagating a surface acoustic wave on a piezoelectric substrate.

As the surface acoustic wave device, a transversal surface acoustic wave filter, which selectively picks up a signal of a desired frequency, has been practically used widely. Characteristics that are demanded of the filter include a wide pass band, a small size, a low loss and good temperature characteristics. In order to realize a filter having such characteristics, it is important to select an appropriate piezoelectric substrate and an appropriate electrode structure.

Among characteristics demanded of a substrate for a surface acoustic wave device, it is important that the surface wave velocity of the surface acoustic wave (hereinafter sometimes referred to as a SAW velocity) is small for achieving reduction in size; $\kappa^2$, i.e., the square of electromechanical coupling coefficient (hereinafter $\kappa^2$ is also referred to as electromechanical coupling coefficient) is large for achieving a wider pass band; and the temperature coefficient of a center frequency when used for a filter or of a resonance frequency when used for a resonator is small.

Quartz, lithium niobate, lithium tantalate, lithium tetraborate and the like have been often used for a substrate of a surface acoustic wave device. However, such conventional substrates are difficult to realize the small SAW velocity, the large electromechanical coupling coefficient $\kappa^2$ and the small temperature coefficient of frequency at the same time.

Meanwhile, as means for achieving a filter with a low loss, the use of a unidirectional transducer has been proposed. Transversal surface acoustic wave filters in general are bidirectional and therefore they theoretically induce an insertion loss of at least 6 dB. On the other hand, unidirectional transducers have an electrode structure that counteracts the backward wave and generates only the forward wave by adjusting the phases of the excitation wave and the reflection wave. Therefore, it is theoretically possible to realize an insertion loss of a few dB or less.

Unidirectional transducers are roughly classified into multiple-phase unidirectional transducers and single-phase unidirectional transducers. Furthermore, the single-phase unidirectional transducers include those realizing unidirectionality by installing reflectors in an asymmetrical manner, and natural single-phase unidirectional transducers utilizing the anisotropy of the substrate as described, for example, in Published Unexamined Japanese Patent Application Sho 61-136313.

The single-phase unidirectional transducers realizing unidirectionality by asymmetrically installing reflectors require complex electrode structures and, particularly when applied to a high frequency region, the size of the electrodes is reduced, which brings about difficulty in the production thereof.

On the other hand, the natural single-phase unidirectional transducers utilize the anisotropy of the piezoelectric substrate used, and it is therefore possible to use ordinary interdigitated electrodes. This is advantageous in application to a high frequency region.

However, conventionally known substrates having unidirectional characteristics have such problems that the SAW velocity is large, the electromechanical coupling coefficient $\kappa^2$ is small, the temperature coefficient of frequency is large, and the like.

DISCLOSURE OF THE INVENTION

An object of the invention is to provide a surface acoustic wave device that can achieve a wider band and a small size and can achieve a low loss by utilizing the natural single-phase unidirectional transducer characteristics.

The surface acoustic wave device of the invention comprises: a substrate composed of a single crystal belonging to the point group 32, having the $Ca_3Ga_2Ge_4O_{14}$ type crystalline structure, including La, Ta, Ga and O as main components and being represented by a chemical formula $La_3Ta_{0.5}Ga_{5.5}O_{14}$; and an electrode formed on the substrate and having a structure that exhibits natural single-phase unidirectional transducer characteristics in cooperation with anisotropy of the substrate.

According to the surface acoustic wave device of the invention, using the substrate and the electrode mentioned above, it is possible to realize a surface acoustic wave device having a large electromechanical coupling coefficient that is advantageous for achieving a wider band, a small SAW velocity that is advantageous for reduction in size, and also having natural single-phase unidirectional transducer characteristics.

In the surface acoustic wave device of the invention, when the cut angle of the substrate out of the single crystal and a propagation direction of a surface acoustic wave are represented by Eulerian angles($\phi$, $\theta$, $\psi$), $\phi$, $\theta$ and $\psi$ may be in a region where $\phi$ is from $-5°$ to $5°$, $\theta$ is from $135°$ to $155°$, and $\psi$ is from $15°$ to $40°$.

In the surface acoustic wave device of the invention, when a cut angle of the substrate out of the single crystal and a propagation direction of a surface acoustic wave are represented by Eulerian angles ($\phi$, $\theta$, $\psi$), $\phi$, $\theta$ and $\psi$ may be in a region where $\phi$ is from $10°$ to $20°$, $\theta$ is from $140°$ to $157°$, and $\psi$ is from $30°$ to $60°$.

Other objects, features and advantages of the invention will be sufficiently apparent from the following description.

BEST MODES FOR CARRYING OUT THE INVENTION

Embodiments of the invention will be described in detail with reference to the drawings.

Figure 1:
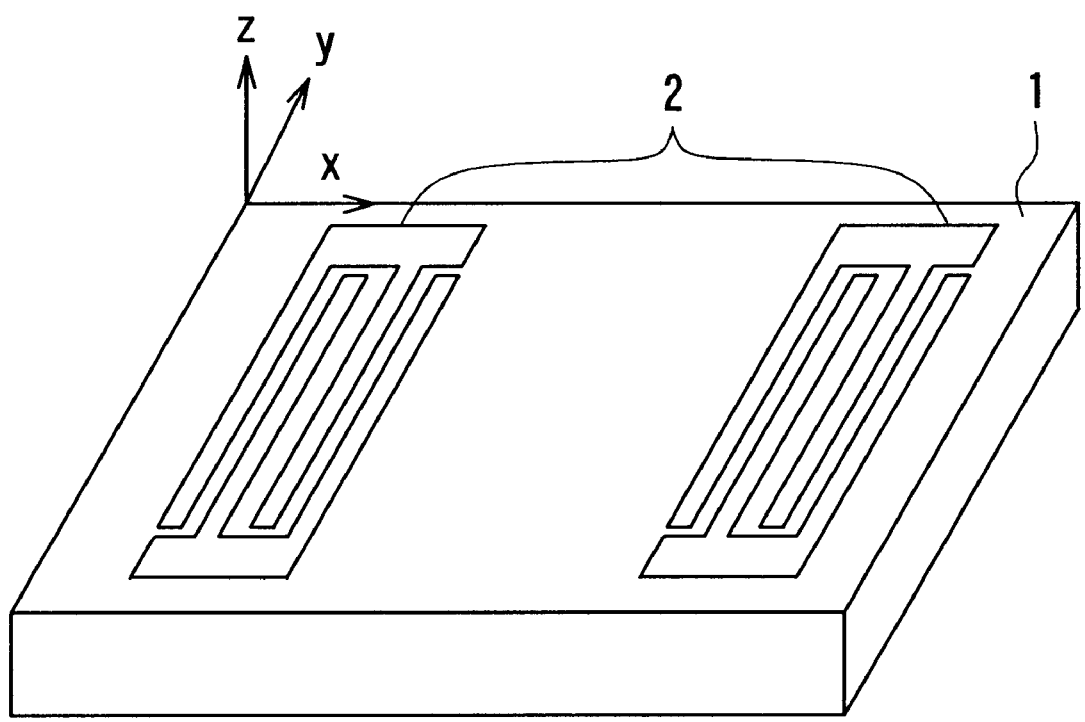
FIG. 1 is a perspective view showing an example of constitution of a surface acoustic wave device according to an embodiment of the invention.

FIG. 1 is a perspective view showing an example of constitution of a surface acoustic wave device according to an embodiment of the invention. The surface acoustic wave device has a piezoelectric substrate 1 and a pair of interdigitated electrodes 2 provided on one main surface of the piezoelectric substrate 1.

As the material of the piezoelectric substrate 1, a single crystal belonging to the point group 32, having the $Ca_3Ga_2Ge_4O_{14}$ type crystalline structure, containing La, Ta, Ga and O as main components, and being represented by a chemical formula $La_3Ta_{0.5}Ga_{5.5}O_{14}$ is used.

The x axis, the y axis and the z axis shown in FIG. 1 are perpendicular to one another. The x axis and the y axis are in the in-plane direction of the substrate 1, and the x axis defines a propagation direction of a surface acoustic wave. The z axis is perpendicular to the plane of the substrate 1 and defines a cut angle (cut plane) of the single crystal substrate. The relationships between the x axis, the y axis and the z axis and the crystallographic axes of the single crystal, i.e., the X axis, the Y axis and the Z axis, namely the cut angle of the substrate out of the single crystal and the propagation direction of the surface acoustic wave can be represented by Eulerian angles($\phi$, $\theta$, $\psi$).

In the surface acoustic wave device of this embodiment, when the cut angle and the propagation direction are represented by Eulerian angles($\phi$, $\theta$, $\psi$)$\phi$, $\theta$ and $\psi$ are in a first region or a second region described below.

The first region is a region where $\phi$ is from $-5°$ to $5°$, $\theta$ is from $135°$ to $155°$, and $\psi$ is from $15°$ to $40°$.

The second region is a region where $\phi$ is from $10°$ to $20°$, $\theta$ is from $140°$ to $157°$, and $\psi$ is from $30°$ to $60°$.

As seen from Published Unexamined Japanese Patent Applications Hei 10-284982 and Hei 10-284983, there are specific combinations of $\phi$, $\theta$ and $\psi$ in the first region and the second region, respectively, in which the SAW velocity of the substrate 1 is 3,000 m/s or less, which is smaller than that of ST quarts, and the electromechanical coupling coefficient $\kappa^2$ of the substrate 1 is sufficiently as large as 0.2% or more.

Furthermore, as will be described later in detail, it has been found that the substrate 1 having such combinations of $\phi$, $\theta$ and $\psi$ in the first region and the second region has the natural single-phase unidirectional transducer (hereinafter sometimes referred to as NSPUDT) characteristics.

Since a single crystal of $La_3Ta_{0.5}Ga_{5.5}O_{14}$ is of the trigonal system, there are combinations of Eulerian angles that are crystallographically equivalent to each other owing to the symmetry of crystals. For example, $(0°, 140°, 25°)$ included in the first region is equivalent to $(0°, 140°, -25°)$, $(60°, 40°, \pm 25°)$ and $(120°, 140°, \pm 25°)$. Furthermore, $(0°, 140°, \pm 25°)$ is equivalent to $(240°, 140°, \pm 25°)$. Similarly, $(15°, 150°, 35°)$ included in the second region is equivalent to $(45°, 30°, 35°)$, $(75°, 30°, -35°)$ and $(105°, 150°, -35°)$. Furthermore, $(15°, 150°, 35°)$ is equivalent to $(135°, 150°, 35°)$ and $(255°, 150°, 35°)$.

In the present invention, the regions of ($\phi$, $\theta$, $\psi$) include regions that are crystallographically equivalent to the first region and the second region as described above.

The single crystal of $La_3Ta_{0.5}Ga_{5.5}O_{14}$ may be those having oxygen defects. The single crystal may contain inevitable impurities, for example, Al, Zr, Fe, Ce, Nd, La, Pt, Ca and the like.

Description will now be given on a search for a cut of the substrate for exerting the NSPUDT characteristics. The search was made using an analysis method combining two theoretical concepts, one being the mode coupling theory, in which the perturbation effect of the electrodes is reflected as the primary effect on the analysis of the operation of a transducer having interdigitated electrodes (interdigital transducer, hereinafter referred to as IDT), and the other being the perturbation theory, in which the mode coupling parameters such as a potential and a particle velocity of a surface acoustic wave, material of strip electrodes and dependency on the electrode structure may be expressed by a closed-form equation. The material constants used for the theoretical calculation were those that were experimentally derived by using the well known resonance method. In the mode coupling theory, intermodal coupling coefficient $\kappa_{12}$ among the four parameters dominating the mode coupling equation, i.e., self-coupling coefficient $\kappa_{11}$, intermodal coupling coefficient $\kappa_{12}$, transduction coefficient $\zeta$ and electrostatic capacitance C per unit length, is directly related to the electrode reflection. The intermodal coupling coefficient $\kappa_{12}$ is a parameter that serves as a core of the operation of the NSPUDT, which is a single-phase unidirectional transducer that positively utilizes the anisotropy of the substrate and the reflection of the strip electrodes. The intermodal coupling coefficient $\kappa_{12}$ is a real number in usual bidirectional IDTs but is a complex number in unidirectional IDTs utilizing the NSPUDT or the structural asymmetry.

According to the first order perturbation theory, the intermodal coupling coefficient $\kappa_{12}$ normalized by the electrode interval $\lambda$ is expressed by the following equation:

$$\kappa_{12}\lambda = |\kappa_{12}|\lambda^{2j\phi O}$$
$$= K_E + K_M \cdot (h/\lambda) \cdot e^{2j\phi M}$$

Herein, h represents a thickness of an electrode film, the first term $\kappa_E$ on the right side represents an electrical perturbation of the electrodes, and the second term represents an elastic perturbation. The intermodal coupling coefficient $\kappa_{12}$ and the reflection coefficient per one wavelength of the strip electrodes have the following relationship:

$$r_+ = -j\kappa_{12}^*\lambda$$

$$r_- = -j\kappa_{12}\lambda$$

Herein, * represents a complex conjugate, and $r_+$ and $r_-$ represent the reflection coefficients viewed in the +x direction and the −x direction, respectively, provided that $r_+ \neq r_-$ in NSPUDT. The phase conditions that provide the optimum NSPUDT characteristics are represented by the following equation:

$$arg(\kappa_{12}\lambda) = \pm 90°, (\phi 0 = \pm 45°)$$

Herein, the complex sign is a positive sign when the forward direction is the +x direction in FIG. 1, and is a negative sign when it is the −x direction. If the film thickness of the electrodes is sufficiently large so that the term of the electrical perturbation may be ignored, the phase angle $2\phi 0$ of the intermodal coupling coefficient $\kappa_{12}$ is determined by the phase angle $2\phi_M$ of the term of the elastic perturbation, and the optimum NSPUDT characteristics are attained when $\phi_M = \pm 45°$. NSPUDT characteristics may be attained even when $\phi_M$ deviates from ±45° by about ±15°.

Figure 2:
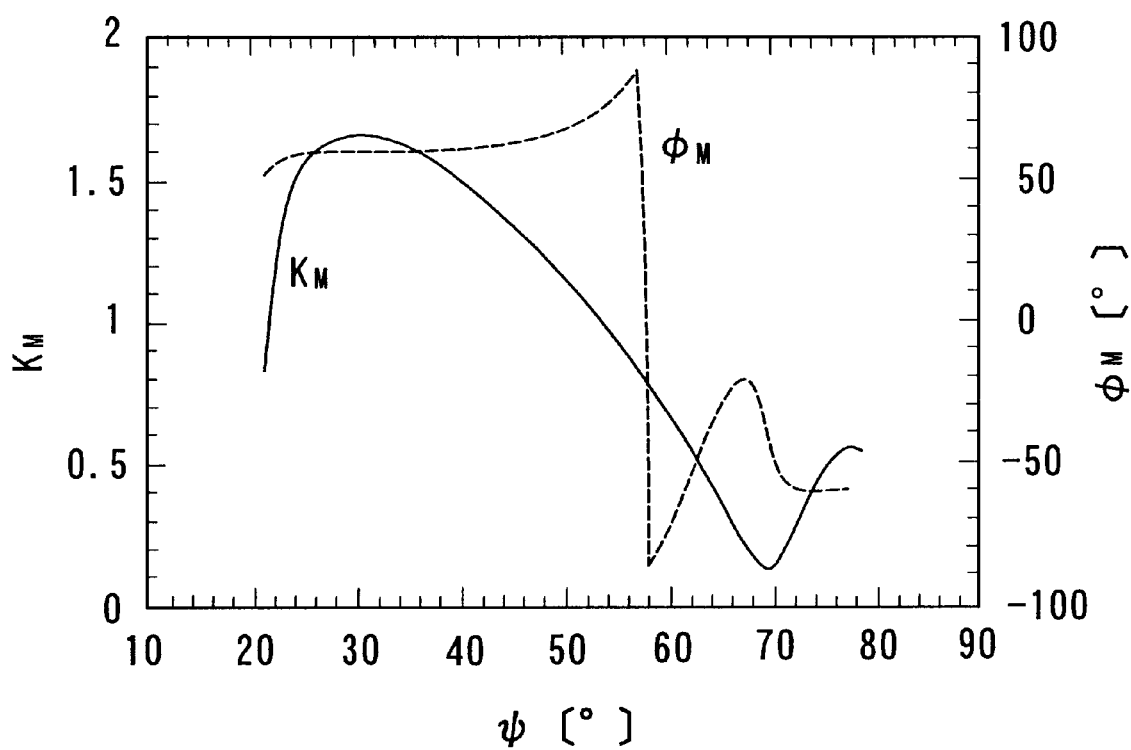
FIG. 2 is a characteristic diagram showing characteristics of a substrate used in the surface acoustic wave device according to the embodiment of the invention.
Figure 3:
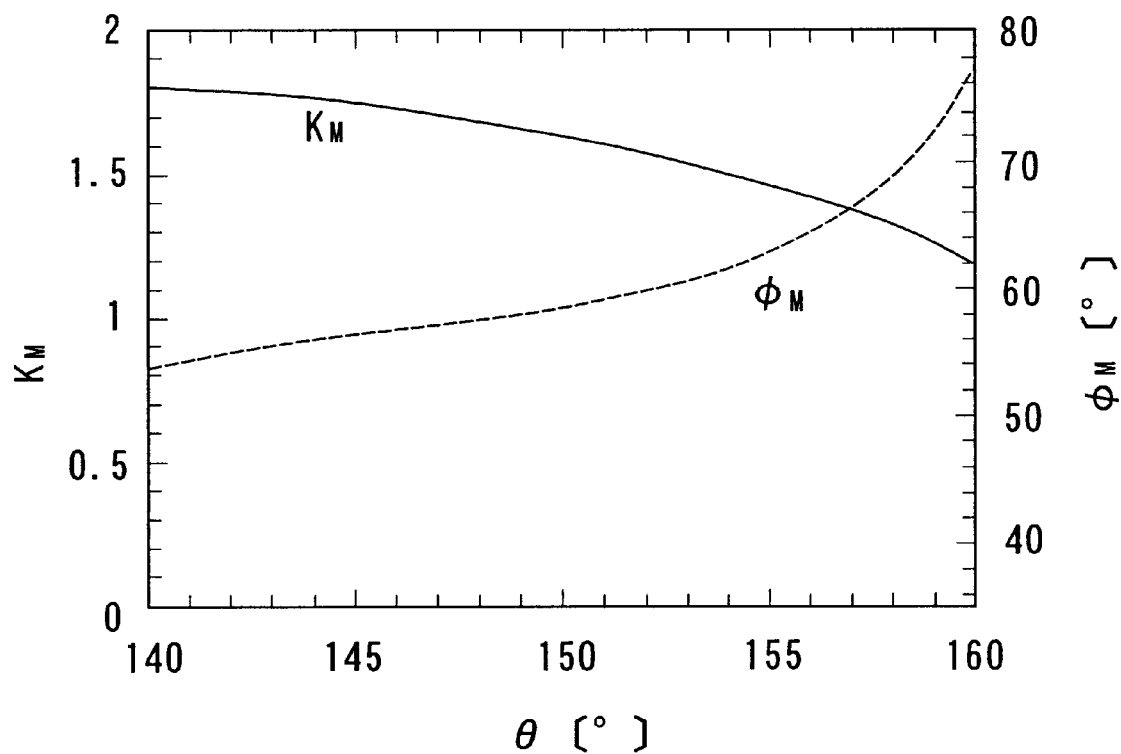
FIG. 3 is a characteristic diagram showing characteristics of the substrate used in the surface acoustic wave device according to the embodiment of the invention.

The results of calculation of $\kappa_M$ and $\phi_M$ in the region represented by Eulerian angles of (0°, 140°, $\psi$=20° to 80°) that overlaps the first region are shown in FIG. 2. Similarly, the results of calculation of $\kappa_M$ and $\phi_M$ in the region represented by Eulerian angles of (13°, θ=140° to 160°, 39°) that overlaps the second region are shown in FIG. 3. The material of the electrodes is aluminum.

FIG. 2 shows that in the range where $\psi$ is from 20° to 40°, $\phi_M$ is about from 50° to 60° and sufficient NSPUDT characteristics go are exhibited, although not the optimum NSPUDT characteristics. Similar results were obtained in other cuts included in the first region. For example, $\phi_M$ is 56° in the cut of (0°, 135°, 23°), and $\phi_M$ is 61° in the cut of (0°, 145°, 23°), both of which exhibit the sufficient NSPUDT characteristics.

FIG. 3 shows that in the range where θ is from 140° to 157°, $\phi_M$ is about from 50° to 66° and the sufficient NSPUDT characteristics are similarly exhibited. Similar results were obtained in other cuts included in the second region. For example, $\phi_M$ is 57° in the cut of (10°, 150°, 39°), and $\phi_M$ is 60° in the cut of (16°, 150°, 39°), both of which exhibit the sufficient NSPUDT characteristics.

Examples of the surface acoustic wave device according to the embodiments of the invention will be described below.

First Example

In a first example, a substrate 1 of cut (0°, 140°, 23°) in an Eulerian angle representation within the first region was prepared, and a surface acoustic wave filter was made using the substrate. In the filter, the number of pairs of interdigitated electrodes 2 was 100 pairs, and the electrodes 2 had an opening length (the length of the interdigitated part) of 80λ (λ: wavelength of the surface acoustic wave) and a normalized film thickness h/λ, i.e., the ratio of the film thickness h of the electrodes to the wavelength λ of the surface acoustic wave, of 0.02.

Figure 4:
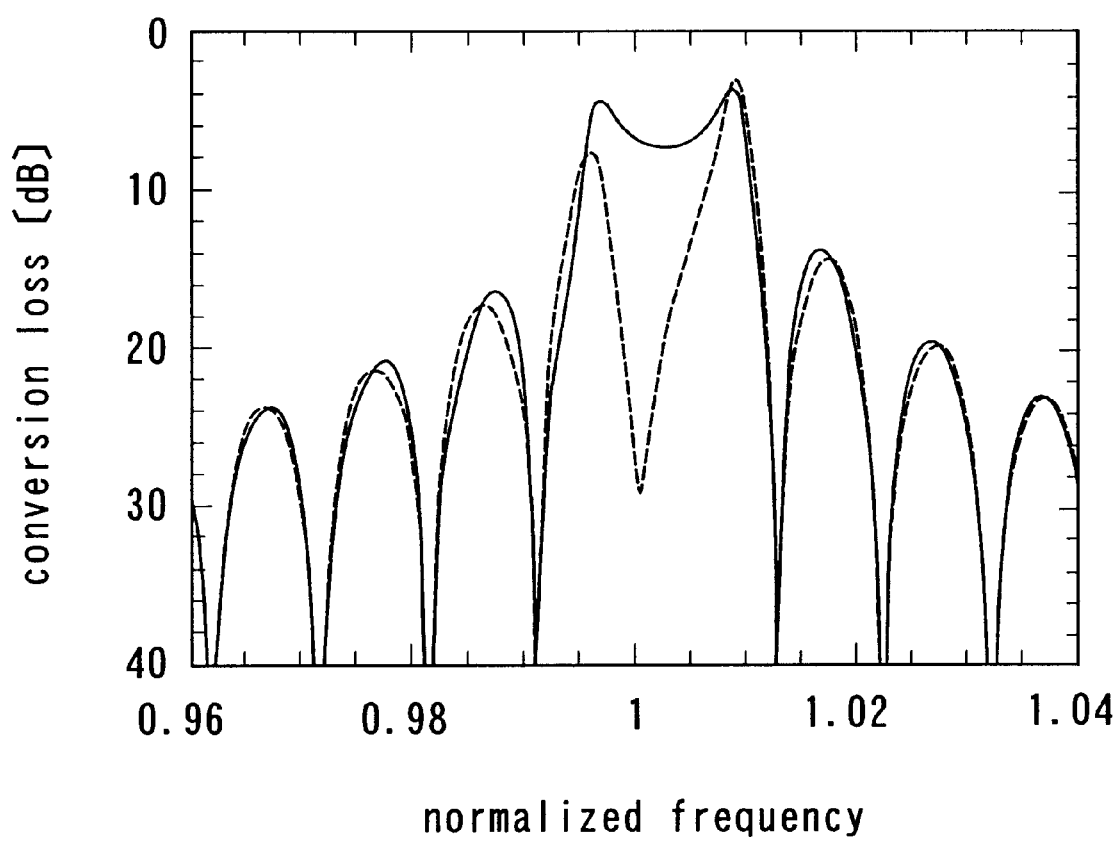
FIG. 4 is a characteristic diagram showing frequency characteristics of a filter in a first example of the invention.

FIG. 4 shows the frequency characteristics of the filter, i.e., the relationship between the normalized frequency and the conversion loss, obtained by calculation. In FIG. 4, the solid line denotes the characteristics in the forward direction, and the broken line denotes the characteristics in the backward direction. It is clear from FIG. 4 that, near the center frequency, there is a great difference in conversion loss between the forward direction and the backward direction, which indicates that the unidirectionality of the NSPUDT characteristics is exhibited.

In order to measure the SAW velocity, the electromechanical coupling coefficient $\kappa^2$ and the temperature coefficient of frequency of the cut of this example, a filter was prepared that had 20 pairs of the interdigitated electrodes 2. The interdigitated electrodes 2 had an opening length of 60λ and a normalized film thickness h/λ of 0.005. Measurement was then performed. As a result of the measurement, the SAW velocity was 2,574 m/s, the electromechanical coupling coefficient $\kappa^2$ was 0.52%, and the temperature coefficient of frequency was 11 ppm/°C. The results show that the cut of this example enables to provide a surface acoustic wave device having a small SAW velocity, a large electromechanical coupling coefficient and good temperature characteristics.

When $La_3Ta_{0.5}Ga_{5.5}O_{14}$ is actually used for a surface acoustic wave filter, it cannot make a filter wherein the forward directions of two transducers face each other. It is possible, however, to design the structure such that the direction of one of the transducers is inverted, or in alternative, reflection is counteracted by employing a λ/8 double electrode structure to deny the directionality as disclosed in Published Unexamined Japanese Application Hei 8-97672.

Second Example

Figure 5:
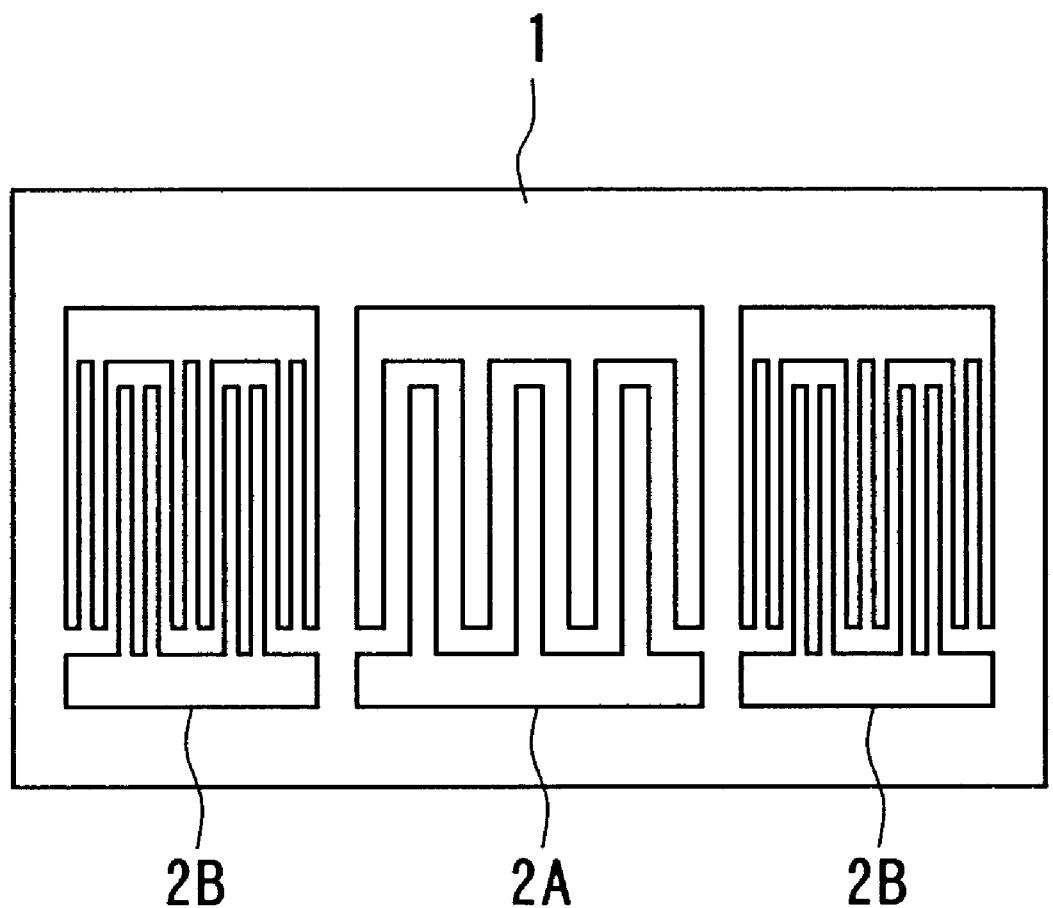
FIG. 5 is an explanatory diagram showing a constitution of an element for measurement in a second example of the invention.

In a second example, a substrate 1 of cut (0°, 140°, 23°) in an Eulerian angle representation within the first region was used to produce an element for measurement including a surface acoustic wave filter as shown in FIG. 5, and the transmission characteristics of the element were measured. The element for measurement shown in FIG. 5 has a transmission electrode 2A as interdigitated electrodes provided on a substrate 1 and two reception electrodes 2B placed on both sides in the propagation direction of the surface acoustic wave in the transmission electrode 2A.

In the element for measurement shown in FIG. 5, the electrode interval (λ) was 30 μm, the number of pairs of the transmission electrode 2A was 100.5 pairs, the opening length (length of the interdigitated part) was 30λ, and the number of pairs of the reception electrode 2B was 20.5 pairs. In this example, an element for measurement having a normalized film thickness h/λ of 0.01 and an element for measurement having a normalized film thickness h/λ of 0.02 were prepared.

Figure 6:
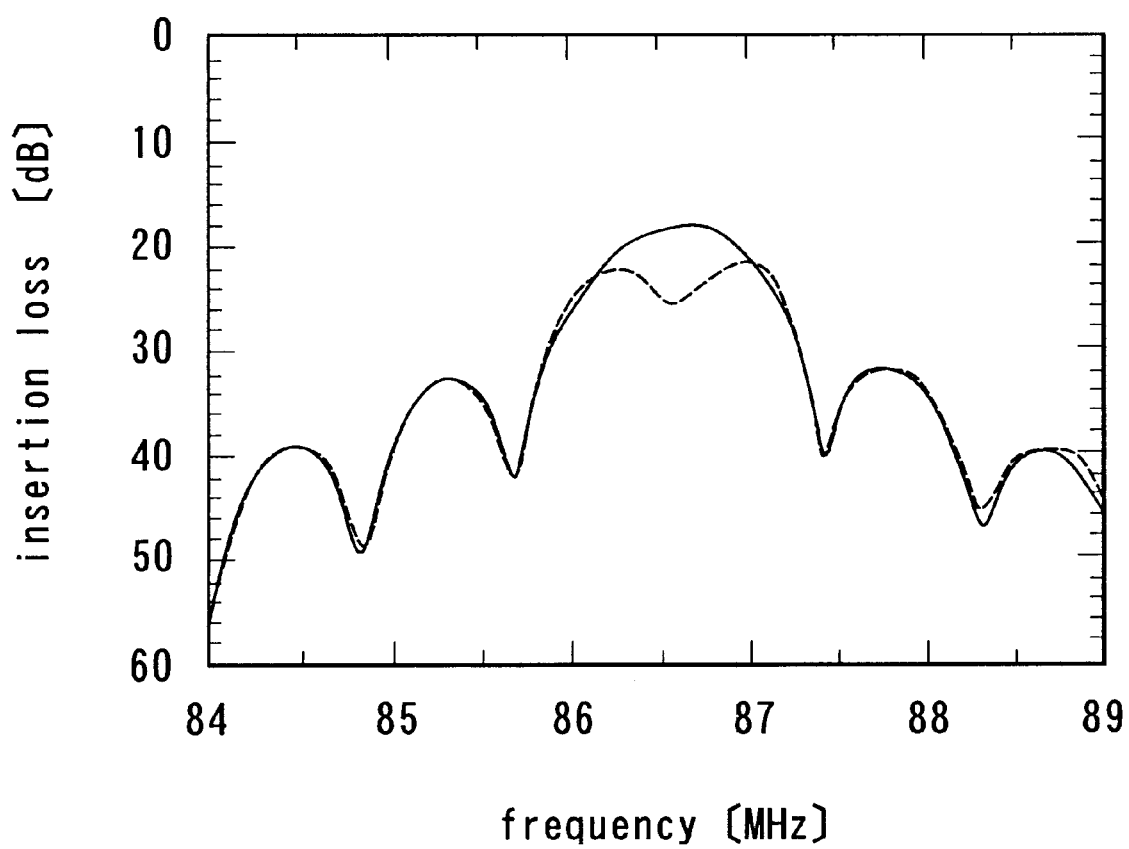
FIG. 6 is a characteristic diagram showing the results of measurement of transmission characteristics of the element for measurement in the second example of the invention.
Figure 7:
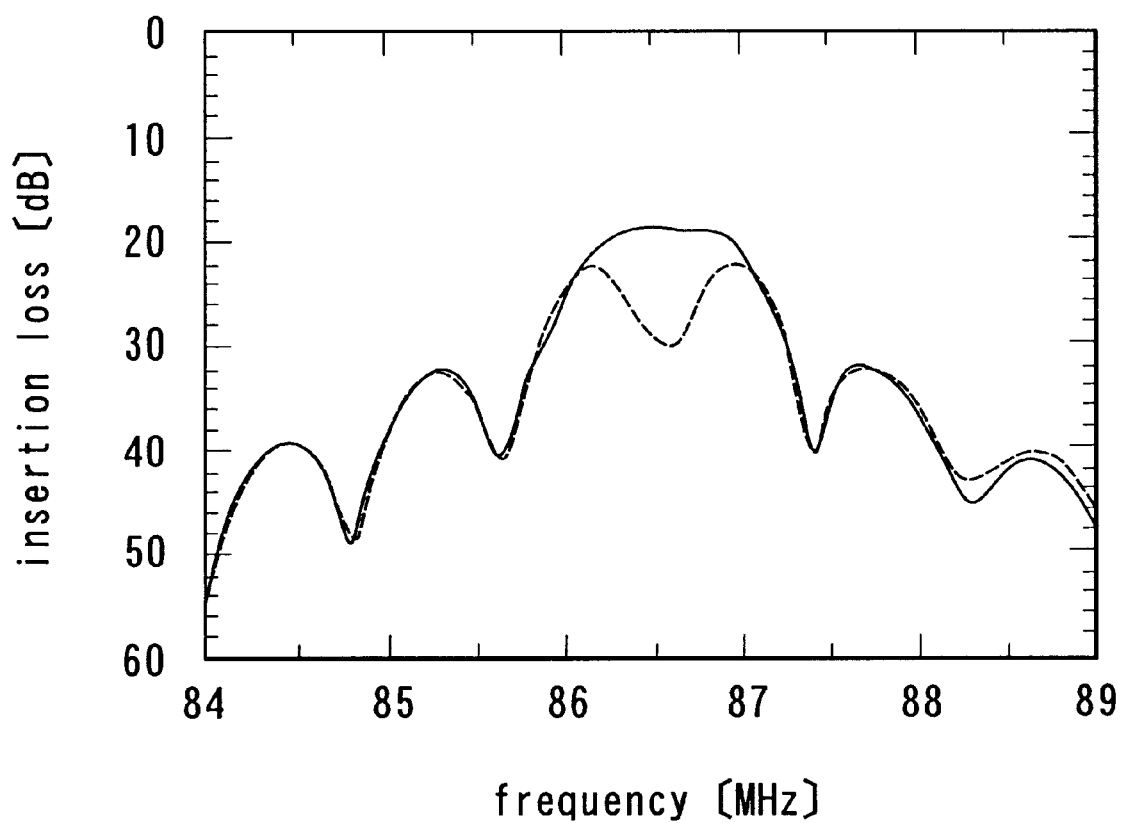
FIG. 7 is a characteristic diagram showing the results of measurement of the transmission characteristics of the element for measurement in the second example of the invention.

FIG. 6 shows the results of the measurement of the transmission characteristics, i.e., the relationship between the frequency and the insertion loss, of the element for measurement having a normalized film thickness h/λ of 0.01. FIG. 7 shows the results of the measurement of the transmission characteristics, i.e., relationship between the frequency and the insertion loss, of the element for measurement having a normalized film thickness h/λ of 0.02. In FIGS. 6 and 7, solid lines denote the characteristics in the forward direction, and the broken lines denote the characteristics in the backward direction. It is seen from FIGS. 6 and 7 that, near the center frequency, there are differences in insertion loss between the forward direction and the backward direction, which indicates that the unidirectionality of the NSPUDT characteristics is exhibited. The differences in insertion loss between the forward direction and the backward direction in FIGS. 6 and 7 are smaller than the difference in conversion loss between the forward direction and the backward direction in FIG. 4. This is because the characteristics shown in FIGS. 6 and 7 include loss in transmission and reception, such as the conversion loss of the reception electrodes 2B, whereas the characteristics shown in FIG. 4 show the loss of the surface acoustic wave filter itself. It is seen from FIGS. 6 and 7, however, that sufficient unidirectionality is exhibited.

Third Example

In a third example, a substrate 1 of cut (0°, 140°, 25°) in an Eulerian angle representation within the first region was used to produce an element for measurement including a surface acoustic wave filter as shown in FIG. 5, and the transmission characteristics of the element were measured. The other conditions of the element for measurement were the same as in the second example.

Figure 8:
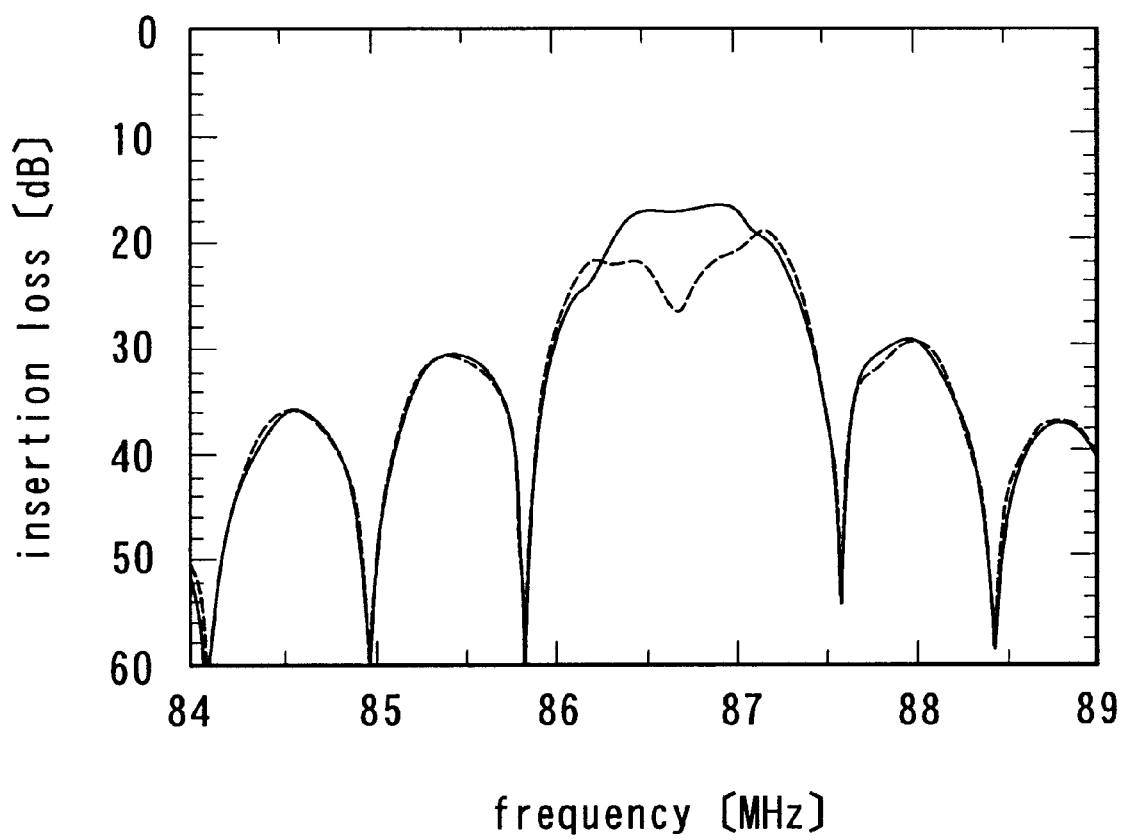
FIG. 8 is a characteristic diagram showing the results of measurement of transmission characteristics of an element for measurement in a third example of the invention.
Figure 9:
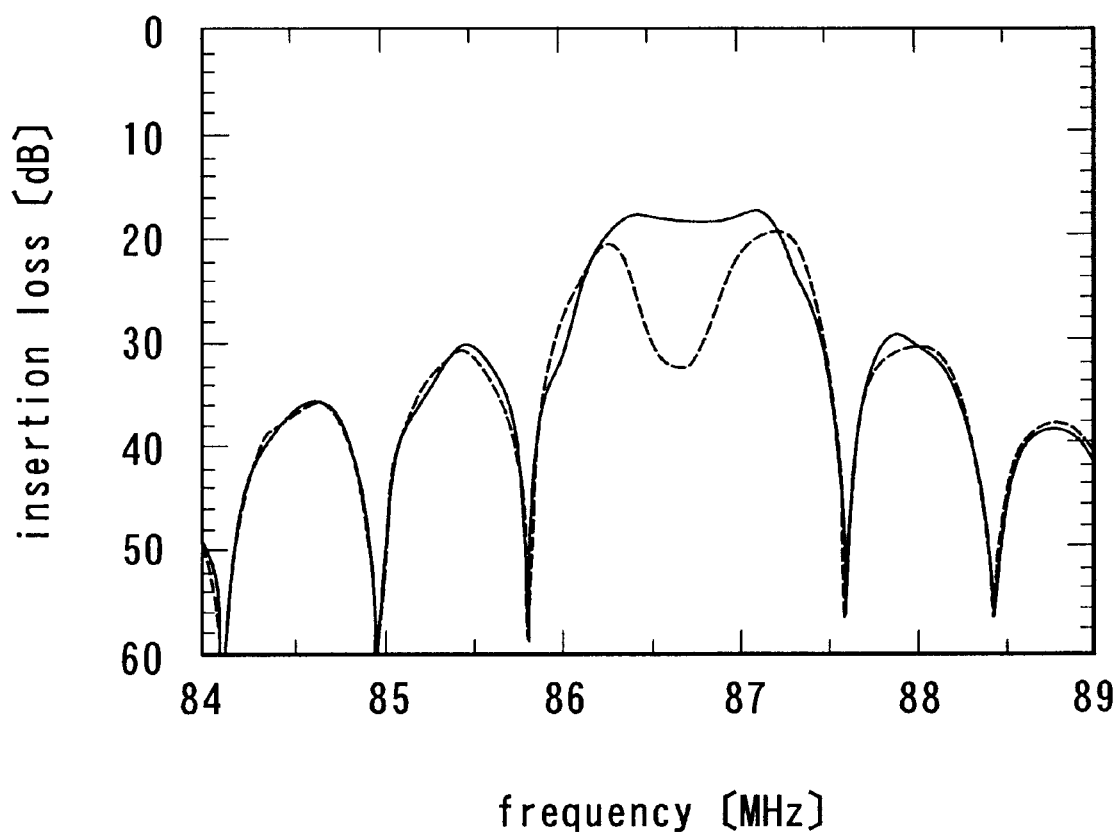
FIG. 9 is a characteristic diagram showing the results of measurement of the transmission characteristics of the element for measurement in the third example of the invention.

FIG. 8 shows the results of the measurement of the transmission characteristics, i.e., relationship between the frequency and the insertion loss, of the element for measurement having a normalized film thickness h/λ of 0.01. FIG. 9 shows the results of the measurement of the transmission characteristics, i.e., relationship between the frequency and the insertion loss, of the element for measurement having a normalized film thickness h/λ of 0.02. In FIGS. 8 and 9, solid lines denote the characteristics in the forward direction, and the broken lines denote the characteristics in the backward direction. It is seen from FIGS. 8 and 9 that, near the center frequency, there are differences in insertion loss between the forward direction and the backward direction, which indicates that the unidirectionality of the NSPUDT characteristics is exhibited.

As described in the foregoing, according to the surface acoustic wave device of the embodiments of the invention, it is possible to attain a wider pass band owing to the large electromechanical coupling coefficient of the substrate 1, to reduce the size of the surface acoustic wave device owing to the small SAW velocity of the substrate 1, and to attain a low loss owing to the NSPUDT characteristics.

The invention is not limited to the embodiments described in the foregoing, but various modifications can be made. For example, the structure of the electrodes is not limited to that shown in FIG. 1, but various kinds of structures can be used.

As described in the foregoing, the surface acoustic wave device of the invention makes it possible to attain a wider pass band owing to the large electromechanical coupling coefficient of the substrate, a reduction in size of the device owing to the small SAW velocity of the substrate, and a low loss owing to the natural single-phase unidirectional transducer (NSPUDT) characteristics.

It is apparent that the present invention may be carried out in various modes and modifications thereof based on the above description. Therefore, within the scope of equivalence of the scope of the following claims, the invention may be practiced otherwise than as specifically described.

What is claimed is:

1. A surface acoustic wave device having natural single-phase unidirectional transducer characteristics, comprising:

a substrate having an anisotropy and composed of a single crystal belonging to the point group 32, the single crystal having the $Ca_3Ga_2Ge_4O_{14}$ type crystalline structure, including La, Ta, Ga and O as main components, and being represented by a chemical formula $La_3Ta_{0.5}Ga_{5.5}O_{14}$, and an electrode formed on said substrate and having a structure that exhibits natural single-phase unidirectional transducer characteristics in cooperation with the anisotropy of said substrate, wherein, when a cut angle of said substrate out of the single crystal and a propagation direction of a surface acoustic wave are represented by Eulerian angles ($\phi$, $\theta$, $\psi$) $\phi$, $\theta$ and $\psi$ are in a region where $\phi$ is from 10° to 20°, $\theta$ is from 140° to 157°, and $\psi$ is from 30° to 60°.

* * * * *